United States Patent
Chang et al.

(10) Patent No.: US 8,589,831 B1
(45) Date of Patent: Nov. 19, 2013

(54) SKEW SENSITIVE CALCULATION FOR MISALIGNMENT FROM MULTI PATTERNING

(75) Inventors: Chih-Hsien Chang, New Taipei (TW); Min-Shueh Yuan, Taipei (TW); Tsung-Hsien Tsai, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 2780 days.

(21) Appl. No.: 13/561,189

(22) Filed: Jul. 30, 2012

(51) Int. Cl.
*G06F 17/50* (2006.01)

(52) U.S. Cl.
USPC ............ 716/55; 716/50; 716/51; 716/52; 716/54

(58) Field of Classification Search
None
See application file for complete search history.

(56) References Cited

U.S. PATENT DOCUMENTS

| | | | |
|---|---|---|---|
| 7,079,223 B2 * | 7/2006 | Rosenbluth et al. | 355/67 |
| 7,698,666 B2 * | 4/2010 | Nequist et al. | 716/132 |
| 7,849,423 B1 * | 12/2010 | Yenikaya et al. | 716/132 |
| 8,001,512 B1 * | 8/2011 | White | 716/119 |
| 2008/0162103 A1 * | 7/2008 | White et al. | 703/13 |
| 2011/0285023 A1 | 11/2011 | Shen et al. | |

* cited by examiner

*Primary Examiner* — A. M. Thompson

(74) *Attorney, Agent, or Firm* — Eschweiler & Associates, LLC

(57) ABSTRACT

Some aspects of the present disclosure provide for a method of accurately simulating variations in an operating parameter, due to processing variations caused by a multi-patterning exposure, by reducing the impact of layout sections having a large width and spacing. The method assigns a skew sensitive index to one or more sections of a multi-patterning layer formed with a first mask. Runlengths of the one or more sections are respectively multiplied by an assigned skew sensitive index to determine a skew variation for each of the one or more sections. The overall skew variation sum is then determined by summing the skew variation for each of the one or more sections. By separately determining the effects of processing variations (e.g., mask misalignment) for different sections of a multi-patterning layer, an accurate measurement of operating parameter variations is achieved.

20 Claims, 7 Drawing Sheets

SKEW SENSITIVE CALCULATION FOR MISALIGNMENT FROM MULTI PATTERNING

BACKGROUND

Multiple patterning lithography (MPL) is one lithography strategy that is used in emerging technology nodes (e.g., 16 nm, 22 nm, 32 nm, etc.). To perform MPL, an IC layout is decomposed according to an algorithm that assigns different colors (e.g., black and gray) to shapes separated by a space less than a printable threshold. The different colors correspond to different photomasks, such that features of a same color are formed on a same mask of a multiple patterning exposure. By separating IC layout data onto different masks, printing below a printable threshold is enabled since the features comprised within each separate mask do not violate the printable threshold.

DETAILED DESCRIPTION

Figure 1:
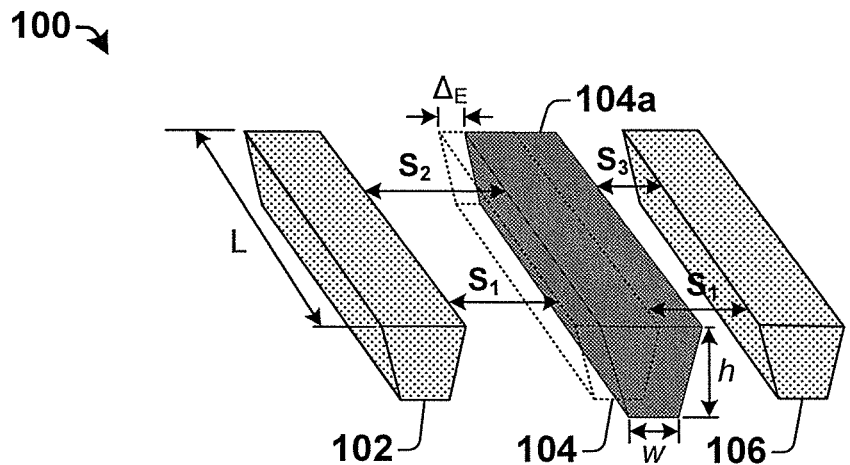
FIG. 1 is a block diagram illustrating an exemplary overlay error and CD variation on metal line segments formed using a double patterning lithography process.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

The use of multiple patterning lithography allows for a lithographic exposure tool to print design features having a minimum feature size smaller than that printable on a single photomask (mask). However, breaking the data of an integrated chip (IC) layout onto multiple masks can introduce a number of processing variations (e.g., an overlay error due to misalignment between masks, CD variation, etc.). For example, FIG. 1 is a block diagram 100 illustrating an exemplary overlay error $\Delta_E$ and CD variation on metal line segments formed using a double patterning lithography process. The block diagram 100 comprises three metal line segments: first and second metal line segments, 102 and 106, formed by a first mask and a second metal line segment 104 formed by a second mask.

Without misalignment between the first and second masks, metal line segments 102-106 are evenly spaced apart from one another by a space $S_1$. However, mask misalignment between the first and second masks introduces an overlay error $\Delta_E$ that causes a misaligned metal line segment 104a to move relative to metal line segments 102 and 106, resulting in a space $S_2=S_1-\Delta_E$ between the metal line segments 102 and 104a and a space $S_3=S_1+\Delta_E$ between the metal line segments 104a and 106. Furthermore, use of separate exposures can increase CD variations (i.e., variations in the height h and width w of the metal line segment) between the metal lines, since each exposure has a different patterning combination.

Such processing variations can cause variations in operating parameters that harm integrated chip performance. For example, the space $S_2$ results in a capacitive coupling (e.g., proportional to $\in \cdot L/S_2$, wherein c is the dielectric constant of a material between the metal line segments and L is the common runlength of the metal line segments) between metal line segments 102 and 104a, which is smaller than the capacitive coupling due to space $S_1$, while space $S_3$ results in a capacitive coupling between metal line segments 104a and 106, which is larger than capacitive coupling due to space $S_1$. Such variations in capacitive coupling between adjacent metal line segments can cause an increase in an RC delay of a metal line segment, slowing operation of the integrated chip. To manage the performance degradation caused by such processing variations, integrated circuits are simulated to estimate circuit behavior and ensure that it is within an acceptable range.

Conventional simulations use two RC extraction techfiles to account for processing variations due to mask misalignment. For example, a simulation may use a first RC extraction file that assumes a maximum cross coupling capacitance $CC_{worst}$ between metal line segments on both sides of a metal line route, and a second RC extraction file assumes a minimum cross coupling capacitance of $CC_{best}$ between metal line segments on both sides of a metal line route. The skew due to mask misalignment is then determined by a difference between the estimated delay of the two RC extraction techfiles. However, such conventional simulation methods are inaccurate. This is because the actual physical shift caused by mask misalignment will produce a maximum variation in capacitive coupling of $CC_{best}$ (due to maximum misalignment)+$CC_{worst}$ (due to minimum misalignment) and a minimum variation in capacitive coupling of zero (no misalignment). In contrast, the conventional simulation will result in a maximum variation in capacitive coupling of $2 \cdot CC_{best}$ and minimum variation in capacitive coupling of $2 \cdot CC_{worst}$. Furthermore, determination of the estimated delay uses two simulations, one for each of the minimum and maximum capacitive coupling, requiring a longer time for simulation.

Accordingly, the present disclosure relates to a method and apparatus for providing an improved simulation of variations in an operating parameter due to processing variations caused by a multi-patterning exposure process. The disclosure is based upon an appreciation that calculations of variations in an operating parameter (e.g., capacitive coupling, delay, etc.) of a route of a multi-patterning layer can be improved by reducing the impact of areas of the route that have a low sensitivity to variations in the operating parameter. This is because the impact of mask misalignment on processing parameters is a function of the physical geometry of the layout (e.g., segment width and space to neighbor parallel lines).

Figure 2A:
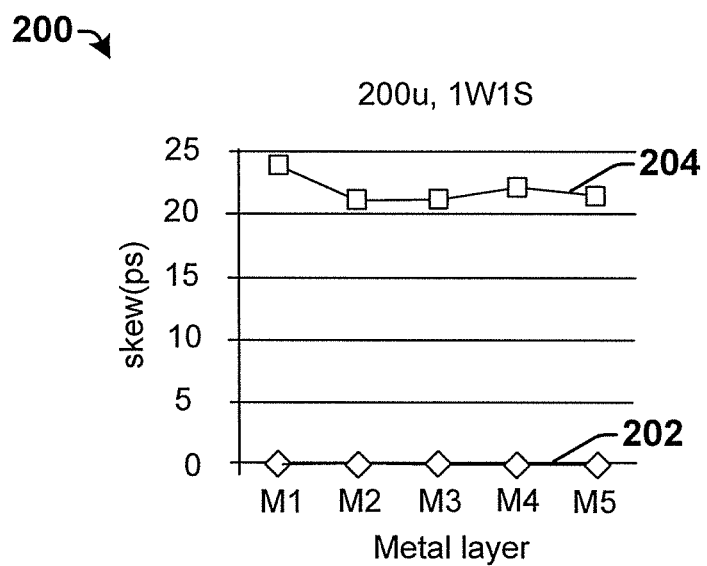
FIGS. 2A-2B are graphs showing how the effect of mask misalignment depends on the physical geometry of an integrated chip layout.

For example, FIG. 2A illustrates a graph 200 showing the effect of mask misalignment on skew (y-axis) for an integrated chip layout having a minimum width metal line separated from adjacent metal lines by a minimum space (i.e., a 1W1S layout) for a plurality of metal layers M1-M5 (x-axis). A first trend line 202 shows a skew (in picoseconds) of metal lines experiencing no mask misalignment. The skew is approximately equal to 0 ps for metal layers M1-M5. A second trend line 204 shows the skew of metal lines experiencing 6 nm of mask misalignment. As shown in graph 200, the 6 nm of mask misalignment causes a skew of between 20 and 25 ps for metal layers M1-M5.

Figure 2B:
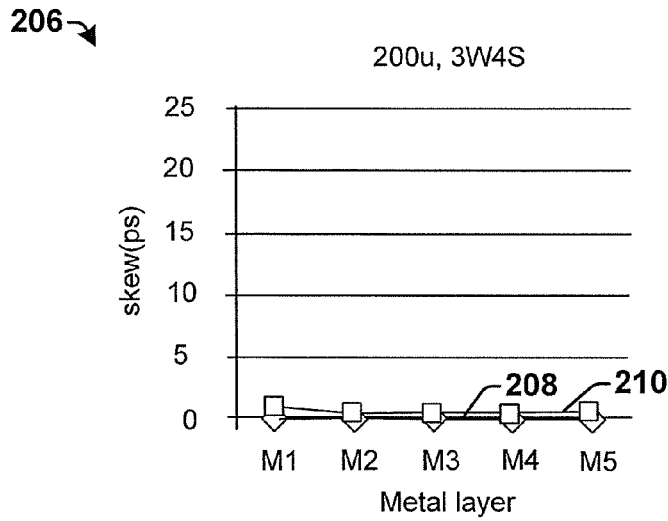

FIG. 2B illustrates a graph 206 showing the effect of mask misalignment on skew (y-axis) for an integrated layout having a metal line width that is twice the minimum line width separated from an adjacent metal line by a space that is four times the minimum line space (i.e., a 2W4S layout) for a plurality of metal layers M1-M5 (x-axis). A first trend line 208 shows a skew that is approximately equal to 0 ps for metal lines experiencing no mask misalignment. A second trend line 210 shows a skew that is still approximately equal to 0 ps for metal lines experiencing 6 nm of mask misalignment. Therefore, graph 206 illustrates that by increasing the width and spacing of metal lines, the effect of mask misalignment is reduced by approximately 95%.

Accordingly, in some embodiments the disclosed method improves the accuracy of simulations for variations in an operating parameter, due to processing variations caused by a multi-patterning exposure, by reducing the impact of layout sections having geometries with a large width and spacing. In some embodiments, the method assigns a skew sensitive index to one or more sections of a route on a multi-patterning layer formed with a first mask. In some embodiments, the skew sensitive index is a weighting factor that is assigned based upon a proximity of adjacent shapes, formed with a second mask, to a section. The runlength of a section is then multiplied by an assigned skew sensitive index to determine a skew variation for each of the one or more sections. The overall skew variation sum is then determined by summing the skew variation for each of the one or more sections of the route. By separately determining the effects of processing variations (e.g., mask misalignment) for different sections of a route on a multi-patterning layer, an accurate measurement of operating parameter variations is achieved.

Figure 3:
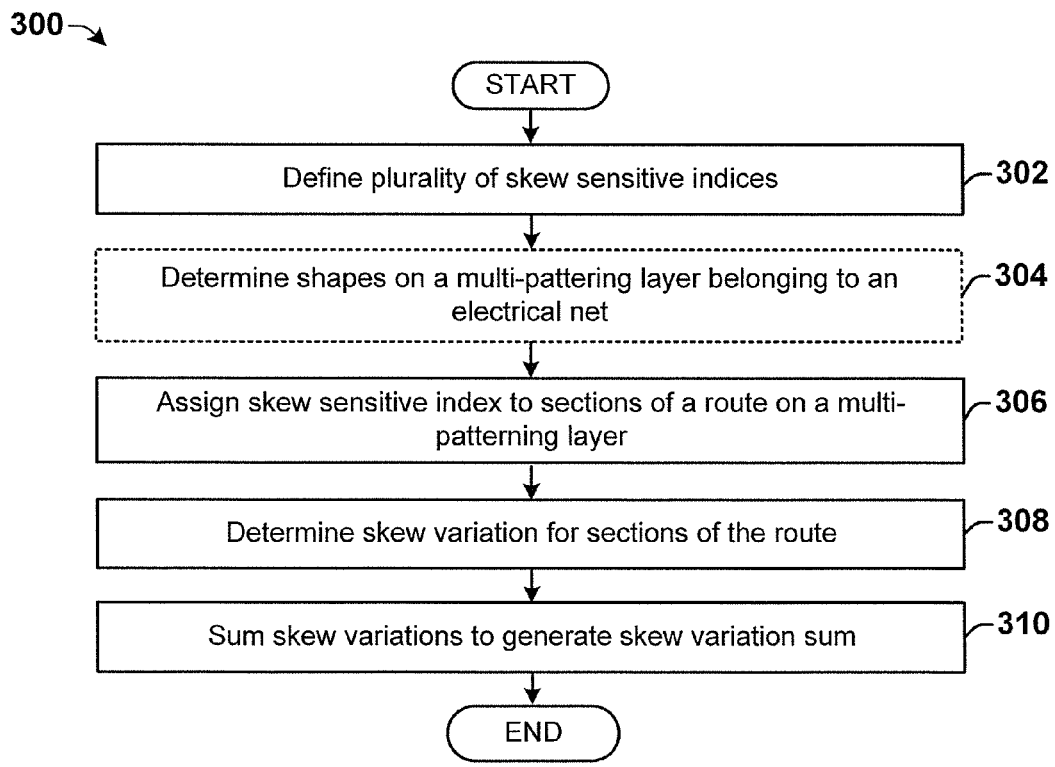
FIG. 3 is a flow diagram illustrating some embodiments of a method for accurately simulating processing variations caused by the use of multiple masks in a multi-patterning lithography process.

FIG. 3 illustrates some embodiments of a method 300 of accurately simulating processing variations (e.g., variations in capacitive coupling) caused by the use of multiple masks in a multi-patterning lithography process.

At step 302, a plurality of skew sensitive indices are defined. The skew sensitive indices are weighting factors that correspond to a variation in an operating parameter due to one or more processing variations caused by a multiple mask exposure process. In some embodiments, the skew sensitive index corresponds to a variation in an operating parameter comprising an extra time delay or capacitance variation. In some embodiments, the processing variations comprise mask misalignment and/or critical dimension (CD) variation. In some embodiments, different skew sensitive indices denote a magnitude of a variation in an operating parameter due to one or more processing variations.

In some embodiments, at step 304, one or more shapes on a multi-patterning layer belonging to an electrical net (i.e., shapes that are electrically connected) are determined within an integrated chip (IC) layout. It will be appreciated that as described herein, a "multi-patterning layer" refers to any layer of an integrated chip design upon which multiple lithography patterning (i.e., more than one photomask exposure) is used to form the layer. For example, in some embodiments, the multi-patterning layer may comprise a "double patterning layer", which refers to any layer of an integrated chip design upon which double patterning lithography is performed.

At step 306, one or more sections of a route on a multi-patterning layer are assigned a skew sensitive index. The route may comprise a line having a plurality of sections, wherein each section has a different geometry associated with a different skew sensitive index (i.e., a geometry that causes a different variation in an operating parameter). In some embodiments, the route comprises plurality of shapes belonging to an electrical net.

In some embodiments, a section of a route on a multi-patterning layer is assigned a skew sensitive index based upon the section's sensitivity to processing variations (e.g., mask misalignment, CD variation). For example, sections that are sensitive to mask misalignment are assigned a different skew sensitive index than sections that are not sensitive to mask misalignment. In some embodiments, the skew sensitive index of a section can be assigned based upon a proximity of adjacent shapes, formed with a second mask, to the section. This is because the impact of mask misalignment is a function of a section's space to adjacent parallel shapes. In some embodiments, the skew sensitive index of a section can be assigned based upon a width of the section. This is because the impact of CD variation is a function of a section's width.

In some embodiments, skew sensitive indices are assigned to one or more sections of a route on a multi-patterning layer depending on a number of parallel neighboring shapes formed by a different mask within a targeted range. This allows skew sensitive indices to be used to consider the impact of neighboring shapes within the targeted range, while minimizing (e.g., ignoring, reducing) the impact of neighboring shapes outside of the targeted range. For example, if a first number of targeted shapes are within the targeted range a first skew sensitive index is assigned to a section. If a second number of targeted shapes are within the targeted range a second skew sensitive index, greater than the first skew sensitive index, is assigned to the section. If a third number of targeted shapes are within the targeted range a third skew sensitive index, greater than the second skew sensitive index, is assigned to the section.

At step 308, a skew variation is determined for one or more sections of the route. For respective sections of the route, a skew variation is determined by multiplying a skew sensitive index associated the section with a run length of the section and one or more neighboring shapes.

At step 310, a skew variation sum is determined. The skew variation sum is determined by adding together the skew variations of sections of a route on a multi-patterning layer (e.g., of sections belonging to an electrical net).

Figure 4A:
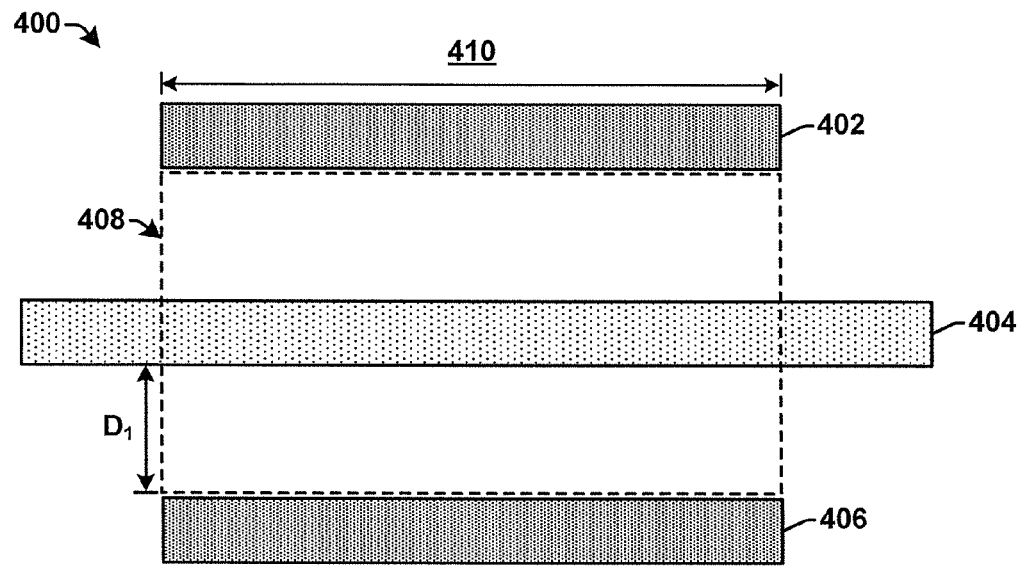
FIGS. 4A-4C illustrate examples of some embodiments of different categorizations of skew sensitive indices.
Figure 4B:
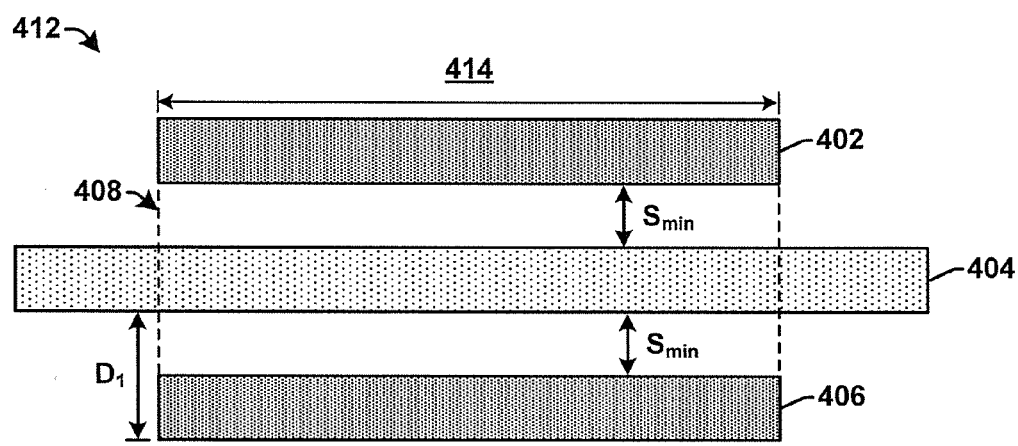
Figure 4C:
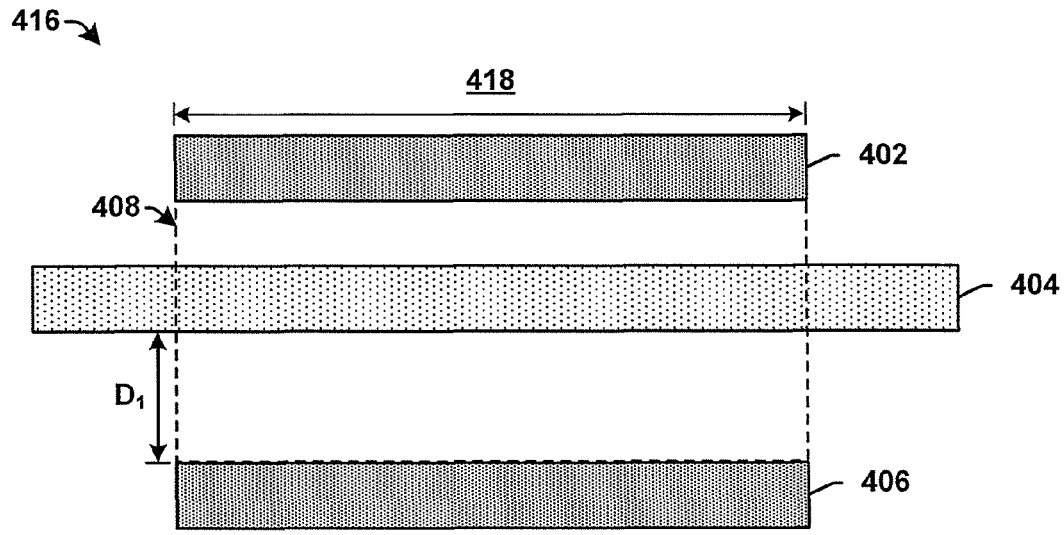

FIGS. 4A-4C illustrate IC layouts 400, 412, and 416 showing examples of some embodiments of different categorizations of skew sensitive indices. As shown in FIGS. 4A-4C, the skew sensitive indices are defined in relation to metal line segments based upon a number of double patterning shapes within a targeted range. Although the disclosed methods are described below in relation to a double patterning layer comprising a metallization layer (i.e., a metal interconnect layer), one of ordinary skill in the art will appreciate that the disclosure is not limited to such layers. Rather, the disclosure may be applied to any layer formed using a multi-patterning lithography process, such as local interconnect layers (e.g., metal zero layers), polysilicon layers, oxide definition layers, etc.

IC layouts 400, 412, and 416 comprises a first metal shape 402, a second metal shape 404, and a third metal shape 406, which are parallel to one another. The first and third metal shapes, 402 and 406, are formed using a first mask and the second metal shape 404 is formed using a second mask. A targeted range 408 extends outward from the second metal shape 404 to a distance $D_1$. The targeted range 408 defines a range outside of which the effect of mask misalignment is relatively small, such that it can be ignored. In some embodiments, the distance $D_1$ that defines the targeted range 408 depends upon a width of the metal shapes 402-406 (e.g., for larger width metal lines the distance $D_1$ is larger). In some embodiments, the distance $D_1$ is equal to the sum of the minimum line width and spacing of the metal layer that metal shapes 402-406 are formed on.

A first IC layout 400 shows a circuit configuration corresponding to a first skew sensitive index. In the first IC layout 400, the first and third metal shapes, 402 and 406, are located outside of the targeted range 408 of a first section 410, such that no shapes formed by a mask different than that which forms the second metal shape 404 are within the targeted range 408. Since first and third metal shapes, 402 and 406, are not within the targeted range 408, their influence on second metal shape 404 is relatively small and the second metal shape 404 experiences a small processing variation due to mask misalignment in the first section 410. Therefore, second metal shape 404 in IC layout 400 is assigned a first skew sensitive index. In some embodiments, the first skew sensitive index is equal to zero. By setting the first skew sensitive index equal to zero, the impact of the first and third metal shapes, 402 and 406, are essentially ignored in the first section 410 during simulations of processing variations. By essentially ignoring the impact of the first and third metal shapes, 402 and 306, in sections assigned the first skew sensitive index the total capacitive coupling of a metal line is more accurately simulated and calculation time of the simulation is reduced.

A second IC layout 412 shows a circuit configuration corresponding to a second skew sensitive index. In the second IC layout 412 comprises the first and third metal shapes, 402 and 406, are located within the targeted range 408 of a second section 414, which extends outward from the second metal shape 404 to a distance $D_1$, such that two parallel shapes formed by a mask different than that which formed the second metal shape 404 are located within the targeted range 408 in the second section 414.

Since first and third metal shapes, 402 and 406 are within the targeted range 408, their influence on the second metal shape 404 is relatively large and the second metal shape 404 experiences a relatively large processing variation due to mask misalignment in the second section 414. For example, since the first metal shape 402 is separated from the second metal shape 404 by a spacing $S_{min}$ that places the first metal shape 402 within the targeted range 408, a capacitive coupling $C_1 = \in \cdot L_1/S_{min}$ results between the first metal shape 402 and the second metal shape 404. Similarly, since the third metal shape 406 is separated from the second metal shape 404 by a spacing $S_{min}$ that places the first metal line within the targeted range 408, a capacitive coupling $C_3 = \in \cdot L_3/S_{min}$ results between the first metal shape 402 and the second metal shape 404. The total cross coupling capacitance on the second metal shape 404 due to shapes within the targeted range 408 is equal to the sum of the capacitive coupling $C_1$ and $C_3$. Since $C_1 + C_3 > 0$, the second section 414 of the second metal shape 404 is assigned a second skew sensitive index greater than the first skew sensitive index.

A third IC layout 416 shows a circuit configuration corresponding to a third skew sensitive index. In the third IC layout 416 comprises the first metal shape 402 is located within the targeted range 408 of a third section 418, while the third metal shape 406 is located outside of the targeted range 408, such that one parallel shape formed by a mask different than that which is formed the second metal shape 404 is located within the targeted range 408 of the third section 418. Since the first metal shape 402 is within the targeted range 408, its influence on the second metal shape 404 is relatively large, causing a relatively large processing variation due to mask misalignment. For example, since the first metal shape 402 is separated from the second metal shape 404 by a spacing $S_{min}$ that places the first metal shape 402 within the targeted range 408, a capacitive coupling $C_1 = \in \cdot L_1/S_{min}$ results between the first metal shape 402 and the second metal shape 404. The total cross coupling capacitance on the second metal shape 404 due to shapes within the targeted range 408 is equal to $C_1$. Therefore, since $C_1 + C_2 > C_1 > 0$, the third section 418 of the second metal shape 404 in IC layout 412 is assigned a third skew sensitive index greater than the first skew sensitive index and less than the second skew sensitive index.

Figure 5:
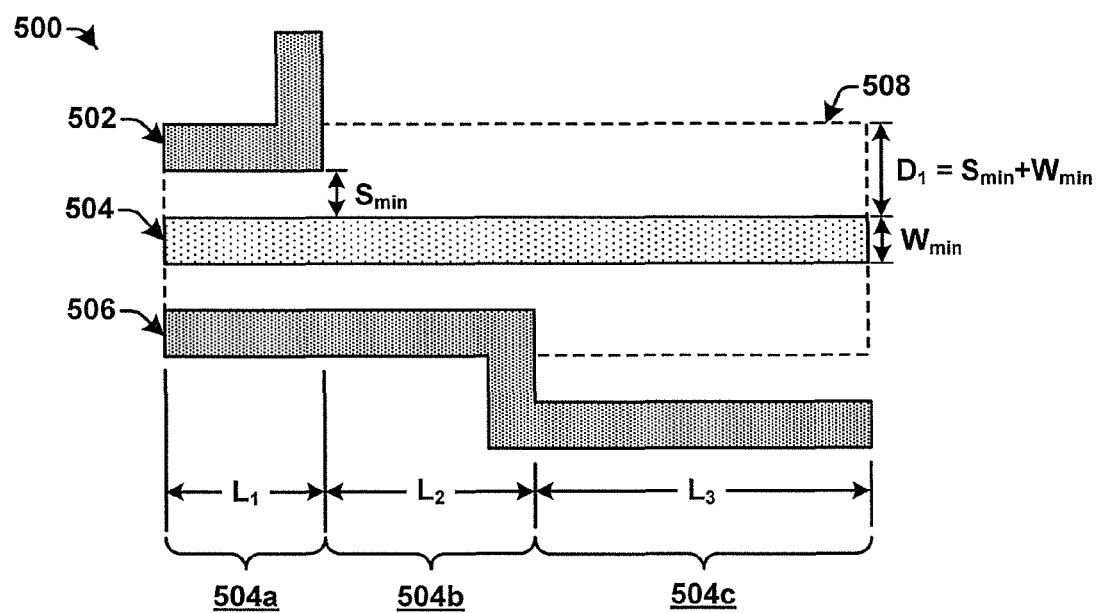
FIG. 5 illustrates some embodiments of an integrated chip layout and a corresponding skew variation sum.

FIG. 5 illustrates some embodiments of an integrated chip layout 500 comprising a route of a metal line having a plurality of sections with different skew sensitive indices according to method 300.

The integrated chip layout 500 comprises a route comprising a second metal line 504. The second metal line 504 is formed using a first mask, and a first and third metal lines, 502 and 506, formed using a second mask. The physical geometry surrounding the second metal line 504 changes over the route, such that the second metal line comprises three segments 504a-504c, each of which has physical geometries leading to different skew sensitive indices.

For example, within the first segment 504a of the second metal line 504, the first and third metal lines 502, 506 are within a targeted range 508, such that the first segment 504a is assigned a first skew sensitive index, index1. The first skew sensitive index index1 is multiplied with the runlength of the first segment $L_1$ to determine a first skew variation $SV_1$. Within the second segment 504b of the second metal line 504, the third metal line 506 is within the targeted range 508, such that the second segment 504b is assigned a second skew sensitive index, index2. The second skew sensitive index index2 is multiplied with the runlength of the second segment $L_2$ to determine a second skew variation $SV_2$. Within the third segment 504c of the second metal line 504, no metal lines are within the targeted range 508, such that the third segment 504c is assigned a third skew sensitive index, index3. The third skew sensitive index index3 is multiplied with the runlength of the third segment $L_3$ to determine a third skew variation $SV_3$.

Based upon the calculated skew variations, $SV_1$-$SV_3$, a skew sum variation S is determined. The skew sum variation S is determined by summing the separate skew variations of each of the sections of the second metal line 504 and is equal to: $S = SV_1 + SV_2 + SV_3 = index1 \cdot L_1 + index2 \cdot L_2 + index3 \cdot L_3$.

Because the skew sensitive index is based on a physical geometry of a section, the value of a skew sensitive index can be determined from a relationship between a physical geometry of a section of a route on a multi-patterning layer and a parameter to be simulated. For example, a cross coupling capacitance value of a metal line is inversely proportional to a spacing (i.e., C=1/S). Therefore, a skew sensitive index for cross coupling capacitance can be determined by taking a difference between the best case and worse case capacitive coupling of a section, which is equal to the difference of the numerators of the best case spacing and the worst case spacing. For example, a skew sensitive index of a section of a metal line with no adjacent parallel metal lines formed from different masks within the targeted range 508 can be determined by taking a difference between the best case and worse case capacitive coupling of such a geometry. However, since there are no adjacent parallel metal lines contributing to the capacitive coupling of the section (i.e., no adjacent shapes are within the targeted range 508), the best case is equal to the worst case and the skew sensitive index of the section is equal to zero (i.e., $1/spacing_{best}$ vs. $1/spacing_{worst}$ -> $1/x$ vs. $1/x$ -> $1/x:1/x$).

A skew sensitive index of a section of a metal line with one adjacent parallel metal line formed from a different mask within the targeted range 508 can be determined by taking a difference between the best case and worse case capacitive coupling of such a geometry. Since one adjacent parallel metal line contributes to the capacitive coupling of the section, a skew sensitive index of the section with one metal line formed from different masks is determined from the equation:

$$1/spacing_{best} \text{ vs. } 1/spacing_{worst} \text{->} 1/(x+mis) \text{ vs. } 1/(x-mis) \text{->} (n-a_1)/x:(n+a_2)/x$$

where the skew sensitive index is equal to $a_1 - a_2$ in fF.

A skew sensitive index of a section with two parallel metal lines formed from a different mask within the targeted range 508 can be determined by taking a difference between the best case and worse case capacitive coupling of such a geometry. Since two parallel metal lines contribute to the capacitive coupling of the section, the skew sensitive index will take into account a mask shift that decreases the spacing between adjacent lines on one side of the section and that increases the spacing between adjacent lines on another side of the section. The resulting skew sensitive index of the section is determined from the equation:

$$1/spacing_{best} \text{ vs. } 1/spacing_{worst} \text{->} 1/x+1/x \text{ vs. } 1/(x-mis)+1/(x+mis) \text{->} 2/x:(2+a)/x$$

where the skew sensitive index is equal to $a$ in fF.

It will be appreciated that the worst case skew sensitive index is due to configurations having a parallel metal line on one side of a section without having a parallel metal line an opposite side. This is because in such configurations, an increase in the expected capacitive coupling of the parallel metal line is not offset by a decrease in capacitive coupling by a parallel metal line on the opposite side. Accordingly, in some embodiments, the capacitive coupling of a section of a metal line can be reduced prior to running post-layout simulation by adding a dummy shape that results in a configuration having a parallel metal line on both sides of a section.

In one example, wherein the second metal line 504 has a minimum width of 32 nm and a minimum space of 32 nm, with a maximum mask misalignment of 4 nm, the above equations give a skew sensitive index within a section with no adjacent parallel metal lines that is equal to zero, a skew sensitive index within a section with one adjacent parallel metal line that is equal to 0.0317, and a skew sensitive index within a section with two parallel adjacent lines that is equal to 0.254. Assuming each section has a length of "X" um, the resulting skew variation sum is equal to 0.0317+0.254=0.286 fF (in comparison to conventional simulations which provide 0.254 fF*3=0.762 fF).

Although described above in relation to a capacitance, it will be appreciated that the skew sensitive indices are not limited to such definitions. For example, in some embodiments, the skew sensitive indices may be defined in relation to a time delay. In such an embodiment, the time delay may be determined through simulations. For example, for a 200 um minimum with and space line simulation results provide for a skew sensitive index within a section with no adjacent parallel lines that is equal to zero, a skew sensitive index within a section with one adjacent parallel line that is equal to 0.48 ps, and a skew sensitive index within a section with two adjacent parallel lines that is equal to 12 ps. Assuming each section has a length of 100 um, the resulting skew variation sum is equal to 0.48 ps+12 ps=12.48 ps (in comparison to conventional simulations which provide 12 ps*3=36 ps).

Furthermore, although the skew sensitive indices have been described in terms of a processing variation comprising mask misalignment, one of ordinary skill in the art will appreciate that the present disclosure is not limited to such processing variations. For example, in some embodiments, skew sensitive indices may be defined in terms of CD variation (e.g., CD variation is varied cross section that can increase extra resistance or capacitance along a line). In such embodiments, a skew sensitive calculation can multiply a skew from a CD variation with related runlength to calculate a skew variation for a CD variation.

Figure 6:
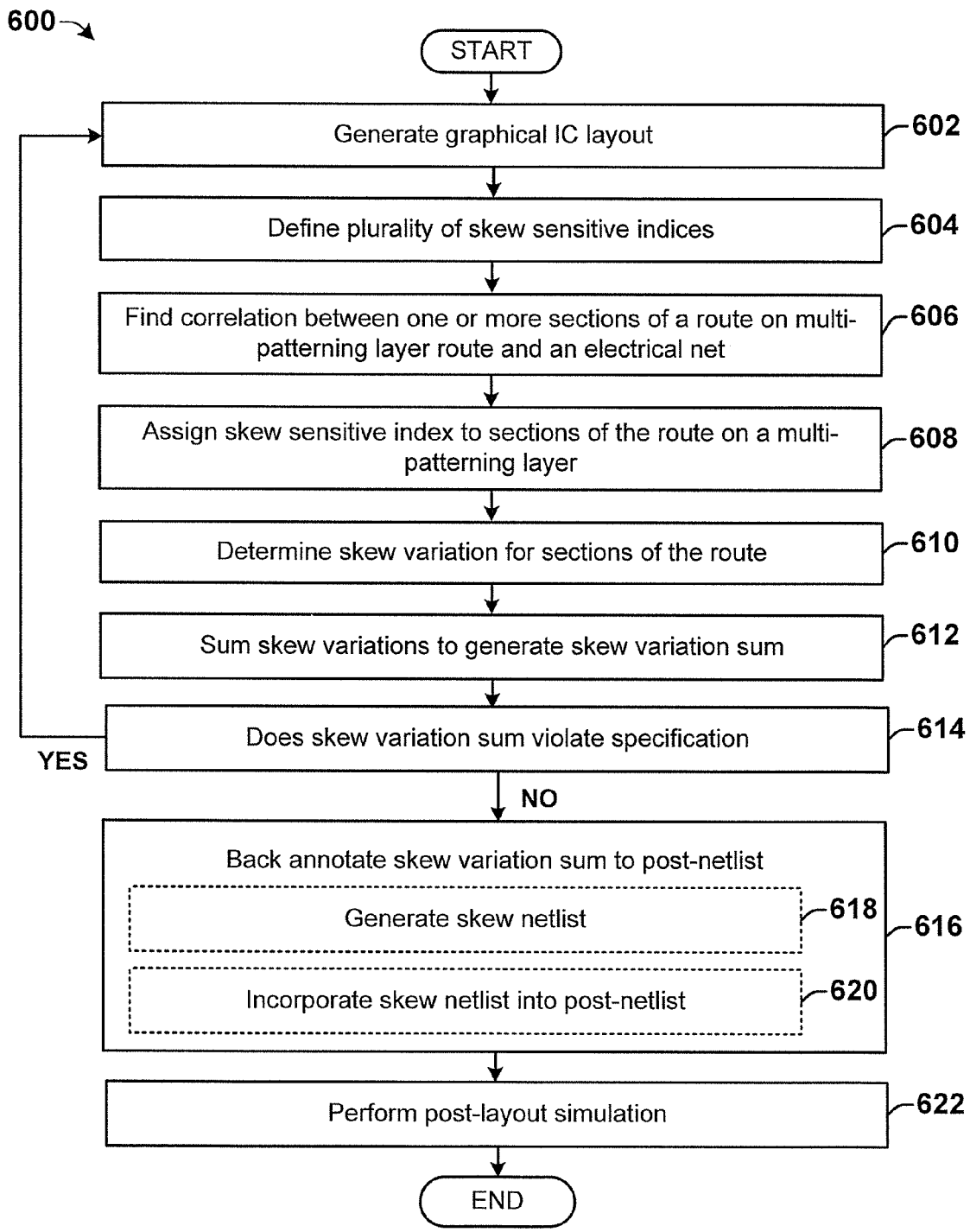
FIG. 6 is a flow diagram illustrating some embodiments of a method for accurately simulating and mitigating the effects of mask misalignment in a multi-patterning process.

FIG. 6 is a flow diagram of a method 600 for accurately simulating and mitigating the effects of mask misalignment in a double patterning process, in accordance with some embodiments.

While the disclosed methods (e.g., method 300, 600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Furthermore, the disclosed methods may be implemented as a apparatus, or article of manufacture using standard programming and/or engineering techniques to produce software, firmware, hardware, or any combination thereof to control a computer to implement the disclosed subject matter (e.g., the circuits shown in FIG. 9. is a non-limiting example of circuits that may be used to implement the disclosed methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At step 602, a graphical layout of an integrated chip (a graphical IC layout) is generated. In some embodiments, the graphical IC layout comprises a Graphic Database System (GDS) file, such as a GDS or GDSII file. In other embodiments, the graphical layout may comprise a CIF or OASIS file format, for example.

At step 604, a plurality of skew sensitive indices are defined. In various embodiments, the plurality of skew sensitive indices may comprise any number of skew sensitive indices (e.g., 2, 3, 4, 5, etc.).

At step 606, a correlation is found between one or more sections of the multi-patterning layer and an electrical net. The correlation allows for shapes associated with an electrical net to be determined.

At step 608, skew sensitive indices are assigned for sections of the route on the multi-patterning layer.

At step 610, a skew variation is determined for each section of the route on the multi-patterning layer. The skew variation is equal to the runlength of a section multiplied by an assigned skew sensitive index.

At step 612, a skew variation sum is generated from the skew variations. The skew variation sum is equal to the sum of the skew variations for the sections of the route on the multi-patterning layer. In some embodiments, the skew variation sum is generated from skew variations along an electrical net. For example, the capacitive coupling of can be determined along an electrical net to determine a RC time delay associated with the electrical net.

At step 614, the skew variation sum is compared to a specification. If the skew variation sum is less than the specification then the graphical IC layout has an acceptable delay. If the skew variation sum is greater than the specification the graphical IC layout has an unacceptable delay, and the method can return to step 602, wherein a GDS file is adjusted. In response to a skew sum variation that violations a specification, the GDS file may be adjusted to reduce the skew sum variation. In some embodiments, in response to a skew sum variation that violates a specification a line with and/or spacing between adjacent lines may be increased to reduce the capacitive coupling between the line and the adjacent lines. In other embodiments, in response to a skew sum variation that violates a specification the capacitive coupling of the metal line can be reduced by adding a dummy shape reduce the capacitive coupling.

By comparing an accurately estimated skew variation to a specification, the method 600 allows for designers to check the skew effect on the design before it is delivered as a GDS file for post-layout simulations, thereby preventing timely iterations between the design phase and post-layout simulations.

In some embodiments, the skew variation sum can be back annotated to a post-netlist at step 616. Back annotating the skew variation sum to a post-netlist adds the impact of the skew estimation into other circuits comprised within the post-netlist. For example, in some embodiments, a skew netlist can be generated to comprise a skew sum variation and can be saved as a file separate from the original post-netlist (step 618). For example, the skew netlist may comprise one or more capacitors having a capacitance equal to the value of the estimated skew variation sum. The capacitor(s) of the skew netlist can be added to the post-netlist, so as to add the impact of the skew estimation into circuits of the post-netlist (step 620).

At step 622, a post-layout simulation is performed. The post layout simulation ensures proper functionality of an integrated chip layout. It is performed based upon parasitic capacitances that are extracted from a graphical IC layout file. In some embodiments, the extraction may be performed by a layout parameter extraction (LPE). In embodiments wherein the skew variation is back annotated, the post-layout simulation can be modified to include the skew variation sum as described above in step 616.

Figure 7A:
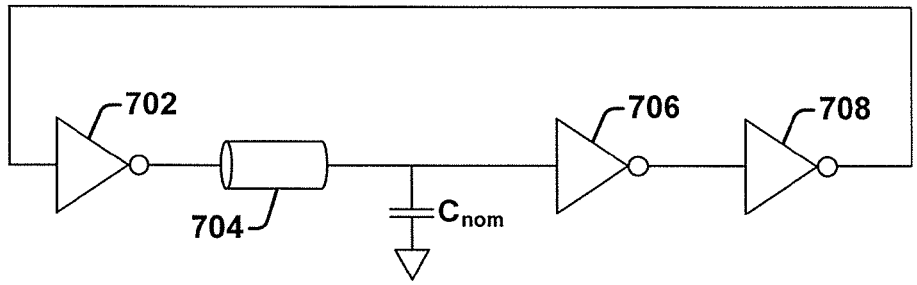
FIGS. 7A-7C illustrate some embodiments the disclosed method applied to an integrated chip layout of a ring oscillator.
Figure 7B:
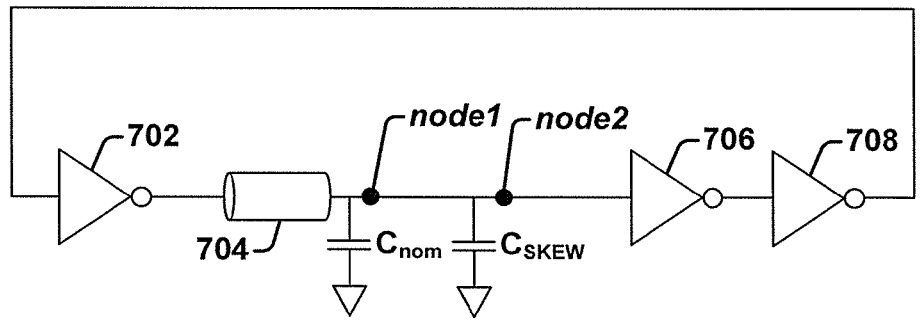
Figure 7C:
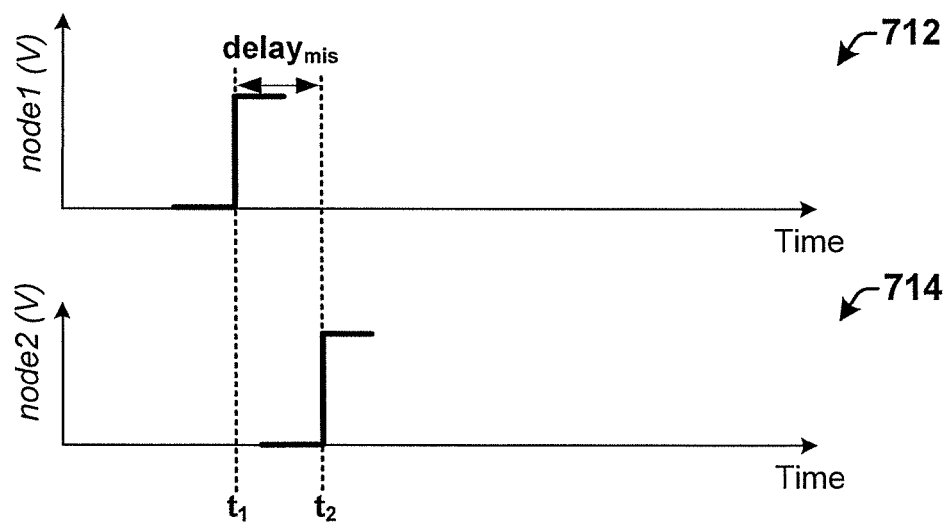

FIGS. 7A-7C illustrate figures showing an exemplary application of back annotation as disclosed in method 600 as applied to an integrated chip layout of a ring oscillator.

FIG. 7A illustrates a ring oscillator 700 illustrating the components of a post-nest list. The ring oscillator 700 comprises 3-inverters 702, 706, and 708 connected in series. The first inverter 702 is separated from the second inverter 706 by a line 704 that is subject to a nominal capacitive coupling $C_{nom}$ due to mask misalignment. The nominal capacitive coupling $C_{nom}$ has a nominal value that is equal to the difference between a best case capacitive coupling (which provides for too fast signals) and a worst case (which provides for too slow signals).

FIG. 7B illustrates a ring oscillator 710 illustrating the components of a post-nest list and a skew net list. The skew net list introduces a skew capacitive coupling $C_{SKEW}$ which introduces the skew variation sum determined by the disclosed method in to the ring oscillator 710. The skew capacitive coupling $C_{SKEW}$ allows for post-layout simulation to include skew effects caused by multi-processing lithography. A first node node1 is connected between a first end of the line 704 and nominal capacitive coupling $C_{nom}$. A second node node2 is connected between nominal capacitive coupling $C_{nom}$ and skew capacitive coupling $C_{SKEW}$.

FIG. 7C illustrates graphs 712 and 714 showing wave forms associated with ring oscillator 710. Graph 712 shows a waveform at node1 that is generated from a post-netlist having a nominal capacitive coupling $C_{nom}$ associated with the line 704. The nominal capacitive coupling $C_{nom}$ does not take into account delay introduced due to mask misalignment. Graph 714 shows a waveform at node2 that is generated from a post-netlist having a nominal capacitive coupling $C_{nom}$ and an additional skew netlist having a skew capacitive coupling $C_{SKEW}$. By generating a separate skew netlist, the effect of the mask misalignment on skew can be introduced into the post-netlist, resulting in a waveform having a delay corresponding to the skew caused by mask misalignment.

Figure 8:
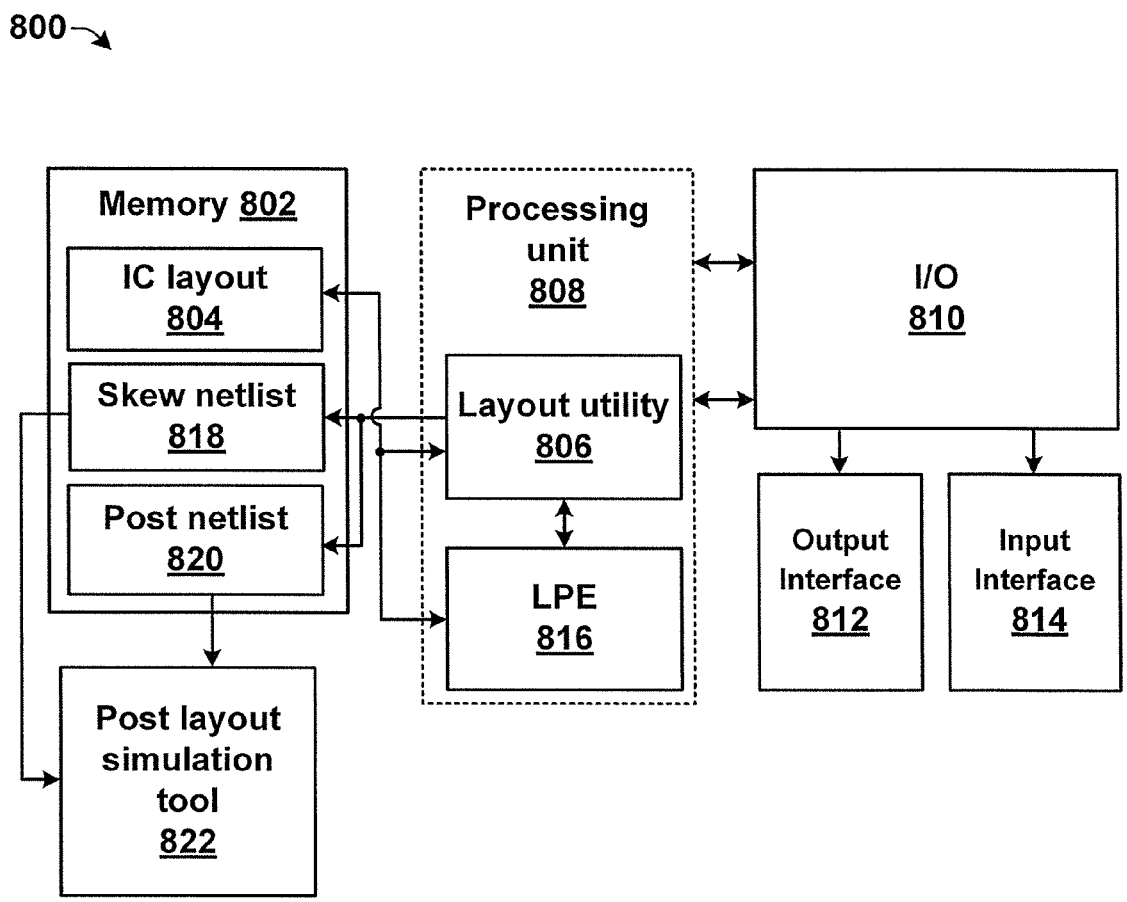
FIG. 8 illustrates some embodiments of a computer system configured to accurately simulate the effects of mask misalignment in a multi-patterning lithography process.

FIG. 8 illustrates some embodiments of a computer system 800 configured to accurately simulate the effects of mask misalignment in a multi-patterning lithography process.

The computer system 800 includes a memory element 802 configured to store a graphical IC layout file 804 comprising a graphical representation of an integrated chip, such as for example a GDSII file. In some embodiments, the memory element 802 comprises a machine readable storage medium, configured to store computer readable instructions for execution by a processing unit 808, for example.

A layout utility 806 (e.g., comprised within the processing unit 808) is configured to access the graphical IC layout file 804. The layout utility 806 is configured to assign skew sensitive indices to a plurality of sections of a route on a multi-patterning layer within the graphical IC layout file 804. In some embodiments, the skew sensitive indices are pre-determined and assigned to a section of the route based upon a geometry of the section. Based upon the assigned skew sensitive indicies, the layout utility 806 is configured to determine a skew variation for the one or more sections by multiplying the assigned skew sensitive indices with a runlength of a section to which a skew sensitive index is assigned. The layout utility 806 then determines a skew variation sum by summing the one or more skew variations.

In some embodiments, the layout utility 806 is further configured to compare the skew variation sum to a predetermined specification. If the skew variation sum violates the predetermined specification, the layout utility 806 provides a warning by way of an I/O 810 to an output interface 812 that allows the layout utility 806 to exchange information with the external environment. In response to the warning, a user (e.g., designer) can utilizes an input interface 814 to make changes to the graphical IC layout file 804. In some embodiments, the output interface 812 may comprise a visual output (e.g., an LCD or LED screen), for example. In some embodiments, the input interface 814 comprises a tactile input (e.g., push buttons and/or a keyboard), for example.

In some embodiments, the layout utility is configured to generate a skew netlist file 818. The skew-netlist file 818 comprises one or more netlist elements corresponding to the skew variation sum (e.g., a capacitor having a value that is equal to the skew sum variation). The post-netlist file 820 comprises one or more netlist elements corresponding to components within the graphical IC layout file 804. The post-netlist file may be generated based upon parasitic parameters extracted from the graphical IC layout file 804 by a layout parameter extraction (LPE) tool 816. In some embodiments, the skew netlist file 818 and the post-netlist file 820 are provided to a post-layout simulation tool 822, which is configured to perform a post-layout simulation of based upon a combination of the skew netlist file 818 and the post netlist file 820.

It will be appreciated that multi-patterning lithography, as provided herein, may refer to any type of multi-patterning exposure scheme. For example, double patterning lithography may comprise double dipole lithography (patterns are decomposed and formed on a first mask having only horizontal lines, and on a second mask having only vertical lines), double patterning technology (a vertex is formed of a vertical segment and a horizontal segment on a same mask), etc.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method and apparatus for providing an improved simulation of variations in an operating parameter due to processing variations caused by a multi-patterning exposure process.

In some embodiments, the present disclosure relates to a method of accurately simulating processing variations caused by a use of multiple masks in a multi-patterning lithography process. The method comprises defining a plurality of skew sensitive indices corresponding to a variation in an operating parameter due to one or more processing variations caused a multiple mask exposure process. The method further comprises assigning one of the plurality of skew sensitive indices to one or more sections of a route on a multi-patterning layer based upon a section's sensitivity to the processing variations. The method further comprises generating one or more skew variations by respectively multiplying skew sensitive indices assigned to the one or more sections with runlengths of the one or more sections. The method further comprises determining a skew variation sum by summing the one or more skew variations.

In other embodiments, the present disclosure relates to a method of accurately simulating processing variations caused by a use of multiple masks in a multi-patterning lithography process. The method comprises defining a plurality of skew sensitive indices corresponding to a variation in an operating parameter due to one or more processing variations caused a multiple mask exposure process. The method further comprises assigning one of the plurality of skew sensitive indices to one or more sections of a route on a multi-patterning layer. The method further comprises generating one or more skew variations by respectively multiplying skew sensitive indices assigned to the one or more sections with runlengths of the one or more sections. The method further comprises determining a correlation between one or more sections of the multi-patterning layer and an electrical net. The method further comprises summing the skew variations associated with the electrical net to determine a skew variation sum of the electrical net.

In other embodiments, the present disclosure relates to a computer system comprising a memory element configured to store an integrated chip layout. The computer system further comprises a layout utility coupled to the memory element and configured to perform the steps of: defining a plurality of skew sensitive indices corresponding to a variation in an operating parameter due to one or more processing variations caused a multiple mask exposure process, assigning one of the plurality of skew sensitive indices to one or more sections of a route on a multi-patterning layer based upon a section's sensitivity to the processing variations; generating one or more skew variations by respectively multiplying skew sensitive indices assigned to the one or more sections with runlengths of the one or more sections; and determining a skew variation by summing the one or more skew variations.

What is claimed is:

1. A method of accurately determining effects of one or more processing variations caused by a use of multiple masks in a multi-patterning lithography process, comprising:
   operating a computer system to define a plurality of skew sensitive indices corresponding to a variation in an operating parameter due to one or more processing variations caused by a multiple mask exposure process;
   operating the computer system to assign one of the plurality of skew sensitive indices to one or more sections of a route on a multi-patterning layer based upon a section's sensitivity to the one or more processing variations;
   generating one or more skew variations by operating the computer system to respectively multiplying skew sensitive indices assigned to the one or more sections with runlengths of the one or more sections; and
   determining a skew variation sum, indicative of the effects of the one or more processing variations, by operating the computer system to sum the one or more skew variations.

2. The method of claim 1, further comprising:
   determining a correlation between one or more sections of the multi-patterning layer and an electrical net; and
   summing the one or more skew variations associated with the electrical net to determine a skew variation sum of the electrical net.

3. The method of claim 1, wherein one of the plurality of skew sensitive indices is assigned to a section based upon a proximity of adjacent shapes to the multi-patterning layer, wherein the adjacent shapes are formed by a mask different than that which forms the multi-patterning layer.

4. The method of claim 1, wherein the plurality of skew sensitive indices comprise:
   a first skew sensitive index corresponding to first sections of the multi-patterning layer that have no shapes formed by a mask different than that which forms the first sections within a targeted range;
   a second skew sensitive index corresponding to second sections of the multi-patterning layer that have parallel shapes formed on one side by a mask different than that which forms the second sections within the targeted range; and a third skew sensitive index corresponding to third sections of the multi-patterning layer that have parallel shapes formed on two sides by a mask different than that which forms the third sections within the targeted range.

5. The method of claim 4, wherein the targeted range extends outward from the multi-patterning layer to a distance that is dependent upon a width of the multi-patterning layer.

6. The method of claim 1, wherein the one or more processing variations comprise:

a misalignment between different masks used in the multiple mask exposure process; or a critical dimension (CD) variation caused by different exposures associated with the different masks used in the multiple mask exposure process.

7. The method of claim 1, wherein the variation within the operating parameter comprises:

a variation in a coupling capacitance between the multi-patterning layer and an adjacent shape; or a variation in delay time of a signal conveyed by the multi-patterning layer.

8. The method of claim 1, wherein the multi-patterning layer comprises a metal interconnect layer.

9. The method of claim 1, further comprising:

running a post layout simulation on a post-netlist file generated from components within a graphical IC layout file comprising the multi-patterning layer.

10. The method of claim 9, further comprising:

comparing the skew variation sum to a specification; and adjusting the graphical IC layout file if the skew variation sum violates the specification to generate an adjusted graphical IC layout file that does not violate the specification.

11. The method of claim 9, further comprising generating a skew-netlist file comprising one or more netlist elements corresponding to the skew variation sum; and back-annotating the skew-netlist file to the post-netlist file prior to running the post layout simulation, so as to include the skew variation sum into the post layout simulation.

12. A method of determining the effects of one or more processing variations caused by a use of multiple masks in a multi-patterning lithography process, comprising:

operating a computer system to define a plurality of skew sensitive indices corresponding to a variation in an operating parameter due to one or more processing variations caused by a multiple mask exposure process;

operating a computer system to assign one of the plurality of skew sensitive indices to one or more sections of a route on a multi-patterning layer;

generating one or more skew variations by operating the computer system to respectively multiplying skew sensitive indices assigned to the one or more sections with runlengths of the one or more sections;

operating a computer system to determine a correlation between one or more sections of the multi-patterning layer and an electrical net; and summing the one or more skew variations associated with the electrical net by operating the computer system to determine a skew variation sum of the electrical net that is indicative of the effects of the one or more processing variations.

13. The method of claim 12, wherein the plurality of skew sensitive indices comprise:

a first skew sensitive index corresponding to first sections of the multi-patterning layer that have no shapes formed by a mask different than that which forms the first sections within a targeted range;

a second skew sensitive index corresponding to second sections of the multi-patterning layer that have parallel shapes formed on one side by a mask different than that which forms the second sections within the targeted range; and a third skew sensitive index corresponding to third sections of the multi-patterning layer that have parallel shapes formed on two sides by a mask different than that which forms the third sections within the targeted range.

14. The method of claim 12, wherein the targeted range extends outward from the multi-patterning layer to a distance equal to a minimum spacing of the multi-patterning level plus a minimum width of the multi-patterning layer.

15. The method of claim 12, wherein the multi-patterning layer comprises a metal interconnect layer.

16. The method of claim 12, further comprising:

running a post layout simulation on a post-netlist file generated from components within a graphical IC layout file comprising the multi-patterning layer.

17. The method of claim 16, further comprising:

comparing the skew variation sum to a specification; and adjusting the graphical IC layout file if the skew variation sum violates the specification to generate an adjusted graphical IC layout file that does not violate the specification.

18. The method of claim 16, further comprising:

generating a skew-netlist file comprising one or more netlist elements corresponding to the skew variation sum; and back-annotating the skew-netlist file to the post-netlist file prior to running the post layout simulation, so as to include the skew variation sum into the post layout simulation.

19. A computer system configured to determine the effects of one or more processing variations caused by a use of multiple masks in a multi-patterning lithography process, comprising:

a memory element configured to store an integrated chip layout;

a layout utility coupled to the memory element and configured to perform the steps of:

defining a plurality of skew sensitive indices corresponding to a variation in an operating parameter due to one or more processing variations caused by a multiple mask exposure process;

assigning one of the plurality of skew sensitive indices to one or more sections of a route on a multi-patterning layer based upon a section's sensitivity to the one or more processing variations;

generating one or more skew variations by respectively multiplying skew sensitive indices assigned to the one or more sections with runlengths of the one or more sections; and determining a skew variation, indicative of the effects of the one or more processing variations, by summing the one or more skew variations.

20. The system of claim 19, wherein the plurality of skew sensitive indices comprise:

a first skew sensitive index corresponding to first sections of the multi-patterning layer that have no shapes formed by a mask different than that which forms the first sections within a targeted range;

a second skew sensitive index corresponding to second sections of the multi-patterning layer that have parallel shapes formed on one side by a mask different than that which forms the second sections within the targeted range; and a third skew sensitive index corresponding to third sections of the multi-patterning layer that have parallel shapes formed on two sides by a mask different than that which forms the third sections within the targeted range.

* * * * *